(12) United States Patent
Tseng et al.

(10) Patent No.: US 12,745,357 B2
(45) Date of Patent: Sep. 22, 2026

(54) SERVER INFORMATION HANDLING SYSTEM BEZEL LATCH SYSTEM

(71) Applicant: Dell Products L.P., Round Rock, TX (US)

(72) Inventors: Chuan Chieh Tseng, Yonghe District (TW); Yi-Hsin Kuan, Taipei City (TW); Lawrence Ying-Hsi Lin, ZhongZheng District (TW)

(73) Assignee: Dell Products L.P., Round Rock, TX (US)

( * ) Notice: Subject to any disclaimer, the term of this patent is extended or adjusted under 35 U.S.C. 154(b) by 111 days.

(21) Appl. No.: 18/777,728

(22) Filed: Jul. 19, 2024

(65) Prior Publication Data

US 2026/0025933 A1 Jan. 22, 2026

(51) Int. Cl.
*H05K 5/02* (2006.01)
*H05K 7/14* (2006.01)

(52) U.S. Cl.
CPC ......... *H05K 5/0221* (2013.01); *H05K 7/1488* (2013.01)

(58) Field of Classification Search
None
See application file for complete search history.

(56) References Cited

U.S. PATENT DOCUMENTS 7,974,092 B2 * 7/2011 Zhang ..................... H05K 5/03 361/679.58
2006/0291155 A1 * 12/2006 Chen ....................... G06F 1/181 361/679.02
2019/0350103 A1 * 11/2019 Sassano ............... H05K 7/1489

* cited by examiner

*Primary Examiner* — Allen L Parker
*Assistant Examiner* — Christopher L Augustin
(74) *Attorney, Agent, or Firm* — Terrile, Cannatti & Chambers, LLP; Stephen A. Terrile

(57) ABSTRACT

A bezel latch system. The bezel latch system includes a bezel and a bezel latch, where the bezel latch includes a bezel latch housing; a bezel latch tab component; and, a bezel latch actuator, the bezel latch actuator being physically coupled with the bezel latch housing and the bezel latch tab component such that the bezel latch tab component moves inwardly relative to the bezel latch housing when the bezel latch actuator is actuated, the bezel latch housing, the bezel latch tab component and the bezel latch actuator being mounted to a center portion of the bezel.

18 Claims, 10 Drawing Sheets

SERVER INFORMATION HANDLING SYSTEM BEZEL LATCH SYSTEM

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for providing a server system with a bi-directional bezel latch system.

In one embodiment, the invention relates to a bezel latch for use with a bezel latch system, the bezel latch comprising: a bezel latch housing; a bezel latch tab component; and, a bezel latch actuator, the bezel latch actuator being physically coupled with the bezel latch housing and the bezel latch tab component such that the bezel latch tab component moves inwardly relative to the bezel latch housing when the bezel latch actuator is actuated, the bezel latch housing, the bezel latch tab component and the bezel latch actuator being mounted to a center portion of a bezel.

In another embodiment, the invention relates to a bezel latch system comprising: a bezel; and, a bezel latch, the bezel latch comprising a bezel latch housing; a bezel latch tab component; and, a bezel latch actuator, the bezel latch actuator being physically coupled with the bezel latch housing and the bezel latch tab component such that the bezel latch tab component moves inwardly relative to the bezel latch housing when the bezel latch actuator is actuated, the bezel latch housing, the bezel latch tab component and the bezel latch actuator being mounted to a center portion of a bezel.

In another embodiment, the invention relates to a system comprising: a chassis; a processor contained within the chassis; a data bus coupled to the processor; and, a bezel latch system coupled with the chassis, the bezel latch system comprising: a bezel; and, a bezel latch, the bezel latch comprising a bezel latch housing; a bezel latch tab component; and, a bezel latch actuator, the bezel latch actuator being physically coupled with the bezel latch housing and the bezel latch tab component such that the bezel latch tab component moves inwardly relative to the bezel latch housing when the bezel latch actuator is actuated, the bezel latch housing, the bezel latch tab component and the bezel latch actuator being mounted to a center portion of a bezel.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
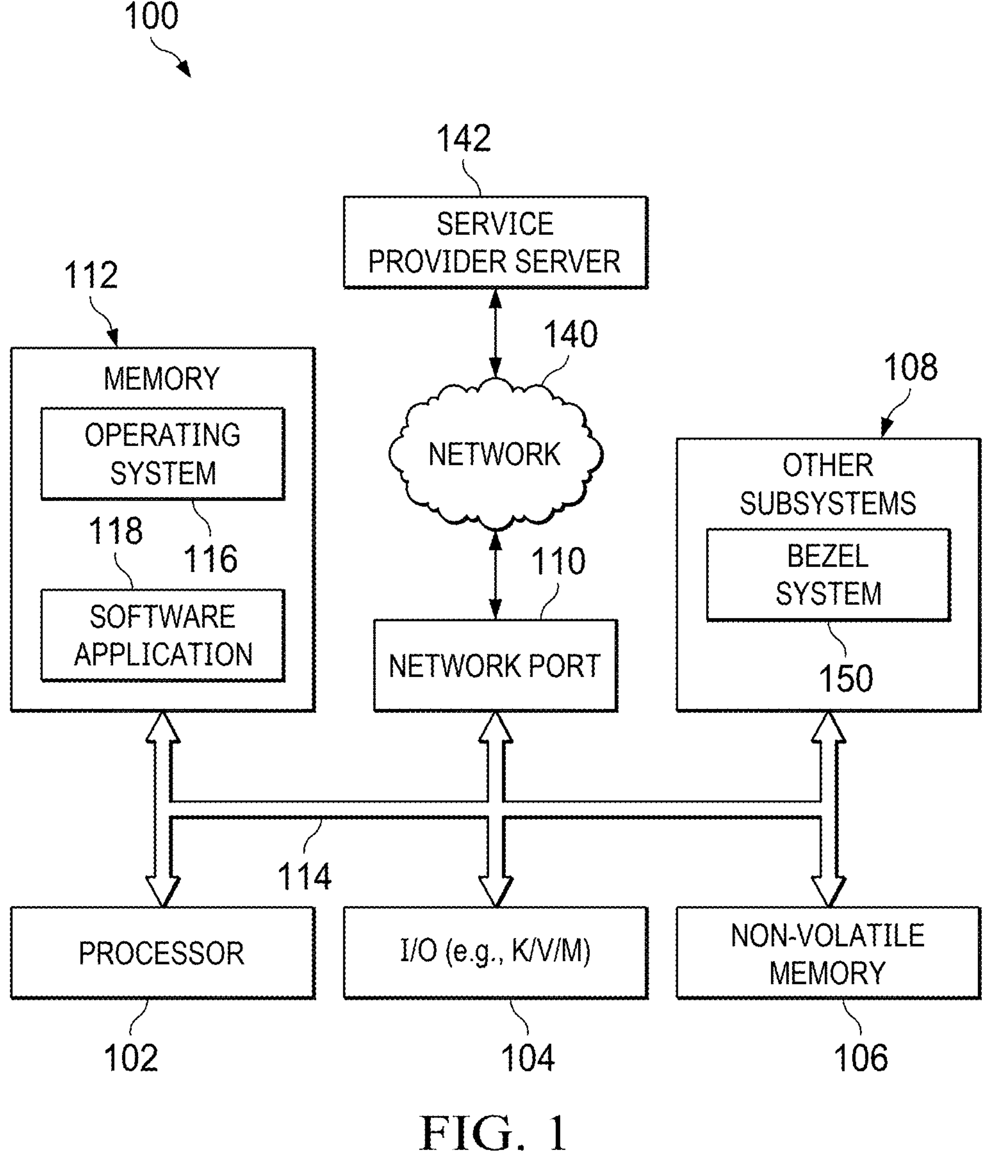
FIG. 1 shows a general illustration of components of an information handling system as implemented in the system and method of the present invention.

Various aspects of the disclosure include an appreciation that it is known to provide information handling systems with chassis which includes a removable front cover, often referred to as a bezel. Various aspects of the present disclosure include an appreciation that the bezel a decorative function by covering drive bays and components of the information handling system. Various aspects of the present disclosure include an appreciation that removal of the bezel is often necessary to provide access to physical components contained within the information handing system chassis.

Various aspects of the disclosure include an appreciation that known bezels often include a bezel latch positioned on one side of the front of the information handling system chassis. Various aspects of the disclosure include an appreciation that known bezel latches often restrict installation of the bezel to a unidirectional installation. Various aspects of the disclosure include an appreciation that known bezel latches often require a two-handed operation to install or remove the bezel.

Various aspects of the disclosure include an appreciation that with known bezel latches, it is often necessary to align a tab on a side of the bezel opposite the bezel latch with a recess along a corresponding front edge of the information handling system chassis when installing the bezel. Various aspects of the present disclosure include an appreciation that different chassis widths often require specialized bezel designs to correctly fit within the chassis width.

A system and method are disclosed for providing a server type information handling system with a bi-directional bezel latch system. In certain embodiments, the bi-directional bezel latch system includes a bezel and a bezel latch mounted to a center portion of the bezel. In certain embodiments, the bezel latch includes a first bezel latch actuator, a second bezel latch actuator, or a combination thereof. In certain embodiments, the bezel latch can be actuated with one hand. In certain embodiments, the bezel latch system is configured to be installed without the need for a latching tab. In certain embodiments, the bezel installation is bi-directional (i.e., the bezel can be installed right side up or upside down relative to the front of the information handling system chassis). In certain embodiments, the right side of the bezel and the left side of the bezel are substantially similar as there is no need to have a latch on one side of the bezel and a mounting tab on the other side of the bezel.

In certain embodiments, because the latch is positioned at the center of the bezel the bezel latch is at the center of mass of the bezel so that a user can easily interact with the bezel without experiencing unbalanced handling of the bezel. In certain embodiments, because the latching occurs at the center of the bezel, the same bezel latch can be used with bezels of different widths. In certain embodiments, the bezel latch design can be used with bezels for different height information handling system chassis (e.g., 1 U height chassis, 2 U height chassis, 4 U height chassis, etc.).

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. In various embodiments, one or both the other subsystems 108 or the network port 110 include a bi-directional latch system 150. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

In certain embodiments, the information handling system 100 comprises a server type information handling system. In certain embodiments, the server type information handling system comprises a blade server type information handling system. As used herein, a blade server type information handling system broadly refers to an information handling system which is physically configured to be mounted within a server rack.

In certain embodiments, the bi-directional latch system 150 includes a bezel and a bezel latch mounted to a center portion of the bezel. In certain embodiments, the bezel latch includes a first bezel latch actuator, a second bezel latch actuator, or a combination thereof. In certain embodiments, the bezel latch can be actuated with one hand. In certain embodiments, the bezel latch system is configured to be installed without the need for a latching tab. In certain embodiments, the bezel installation is bi-directional (i.e., the bezel can be installed right side up or upside down relative to the front of the information handling system chassis). In certain embodiments, the right side of the bezel and the left side of the bezel are substantially similar as there is no need to have a latch on one side of the bezel and a mounting tab on the other side of the bezel.

In certain embodiments, because the latch is positioned at the center of the bezel the bezel latch is at the center of mass of the bezel so that a user can easily interact with the bezel without experiencing unbalanced handling of the bezel. In certain embodiments, because the latching occurs at the center of the bezel, the same bezel latch can be used with bezels of different widths. In certain embodiments, the bezel latch design can be used with bezels for different height information handling system chassis (e.g., 1 U height chassis, 2 U height chassis, 4 U height chassis, etc.).

Figure 2:
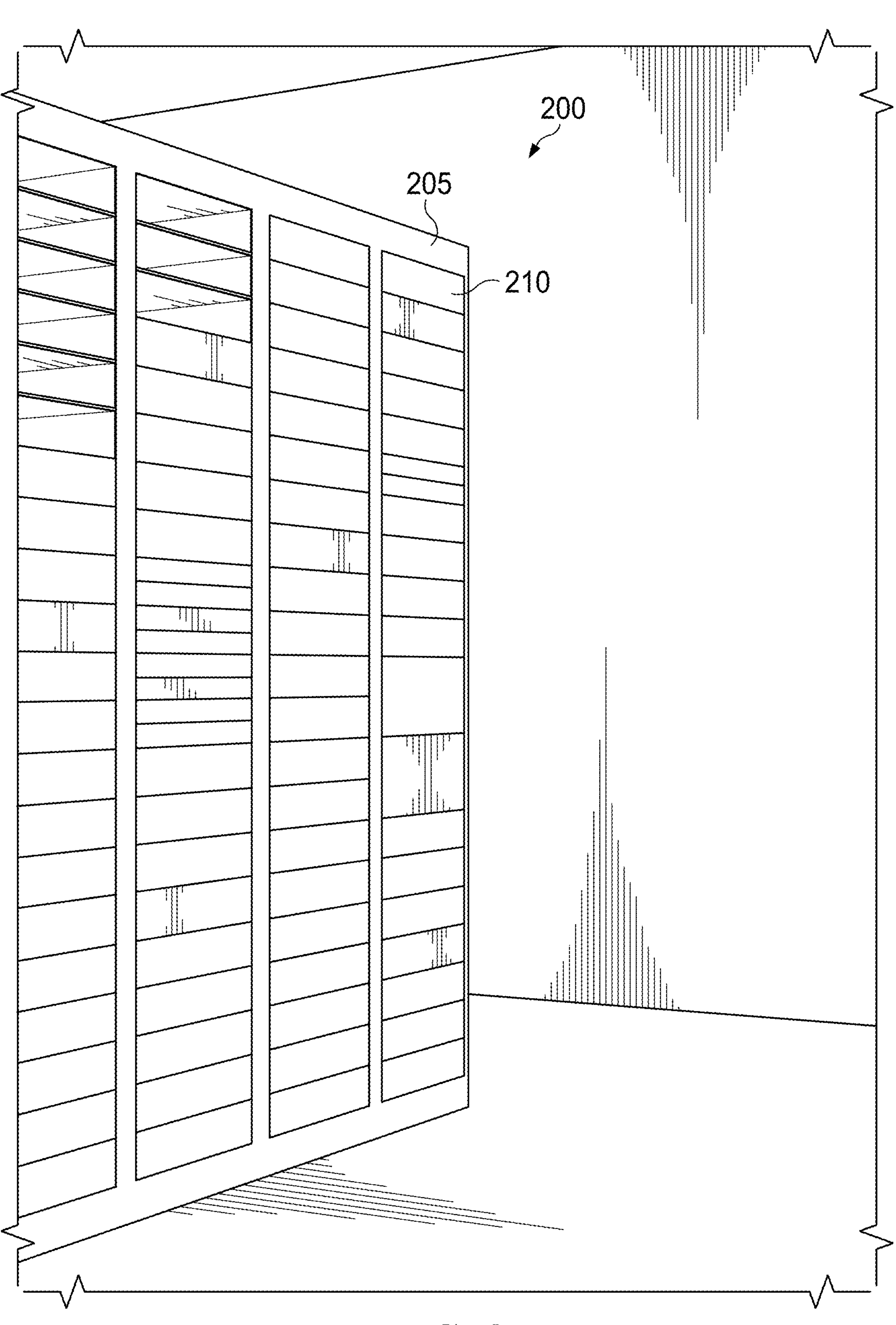
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein, a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuously with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1 U rack unit, a 2 U rack unit and a 4

U rack unit. In general, a 1 U rack unit is substantially (i.e., +/−20%) 1.75" high, a 2 U rack unit is substantially (i.e., +/−20%) 3.5" high and a 4 U rack height is substantially (i.e., +/−20%) 7.0" high.

Figure 3:
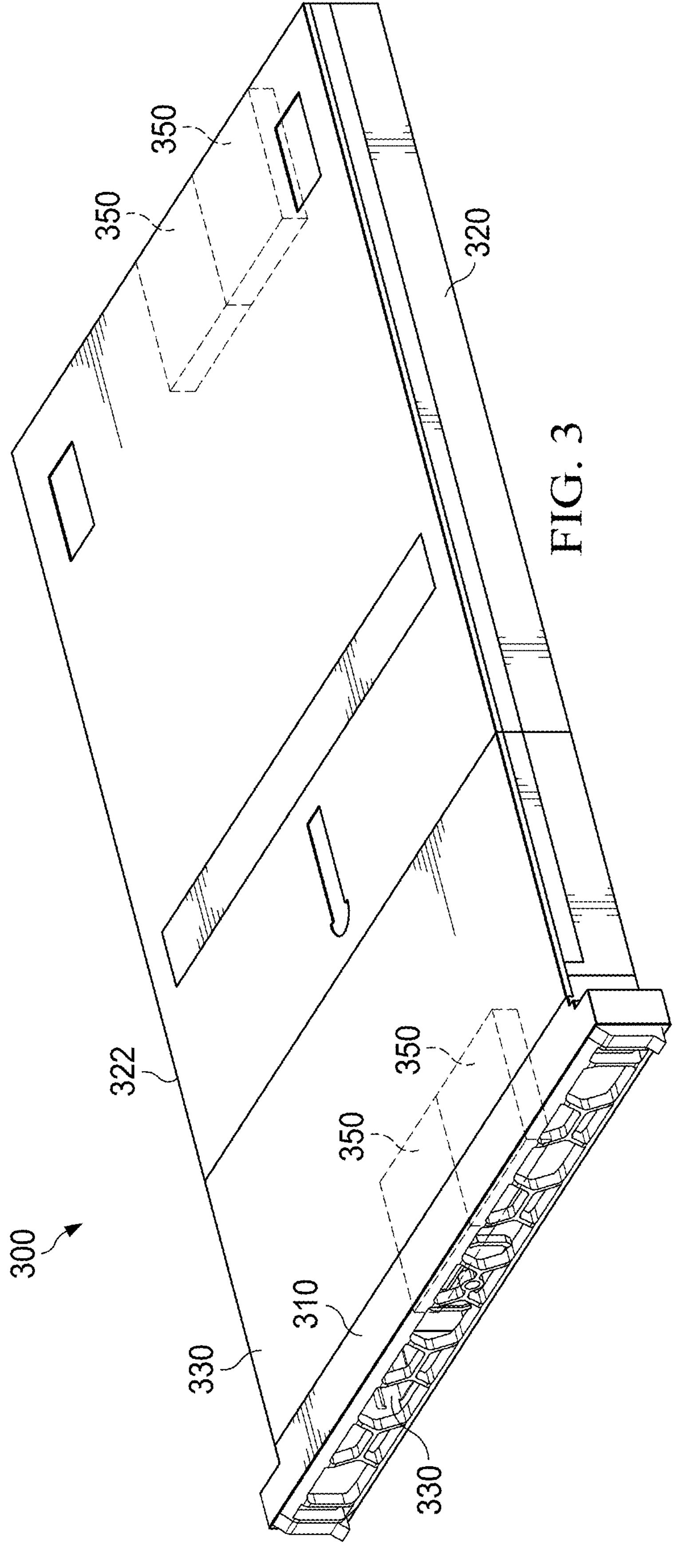
FIG. 3 shows a generalized perspective view of an example server type information handling system.

FIG. 3 shows a generalized perspective view of an example blade server type information handling system 300. In certain embodiments, the server type information handling system includes a front portion 310, which is accessible when the server type information handing system 300 is mounted on a server rack. In certain embodiments, the side portions 320, 322 mount to the rack via respective server mounting components. In certain embodiments, the side portions mount to the rack via respective mechanical guiding features which are mechanically coupled to respective server mounting components. In certain embodiments, the server type information handling system can slide out from the rack via the respective mechanical guiding features. In certain embodiments, internal components of the blade type information handling system 300 may be accessed by removing a top panel 330 of the blade type information handing system 300. In certain embodiments, the blade type information handing system 300 includes one or more bays 350 via which components may be mounted to the blade type information handling system. In certain embodiments, a peripheral system such as a multi-slot peripheral mounting system may be mounted within each bay 350.

In certain embodiments, the information handling system 300 includes a bi-directional bezel latch system. In certain embodiments, the bi-directional latch system corresponds to bi-directional latch system 150. In certain embodiments, the bi-directional latch system includes a bezel and a bezel latch mounted to a center portion of the bezel. In certain embodiments, the bezel latch includes a first bezel latch actuator, a second bezel latch actuator, or a combination thereof. In certain embodiments, the bezel latch can be actuated with one hand. In certain embodiments, the bezel latch system is configured to be installed without the need for a latching tab. In certain embodiments, the bezel installation is bi-directional (i.e., the bezel can be installed right side up or upside down relative to the front of the information handling system chassis). In certain embodiments, the right side of the bezel and the left side of the bezel are substantially similar as there is no need to have a latch on one side of the bezel and a mounting tab on the other side of the bezel.

Figure 4A:
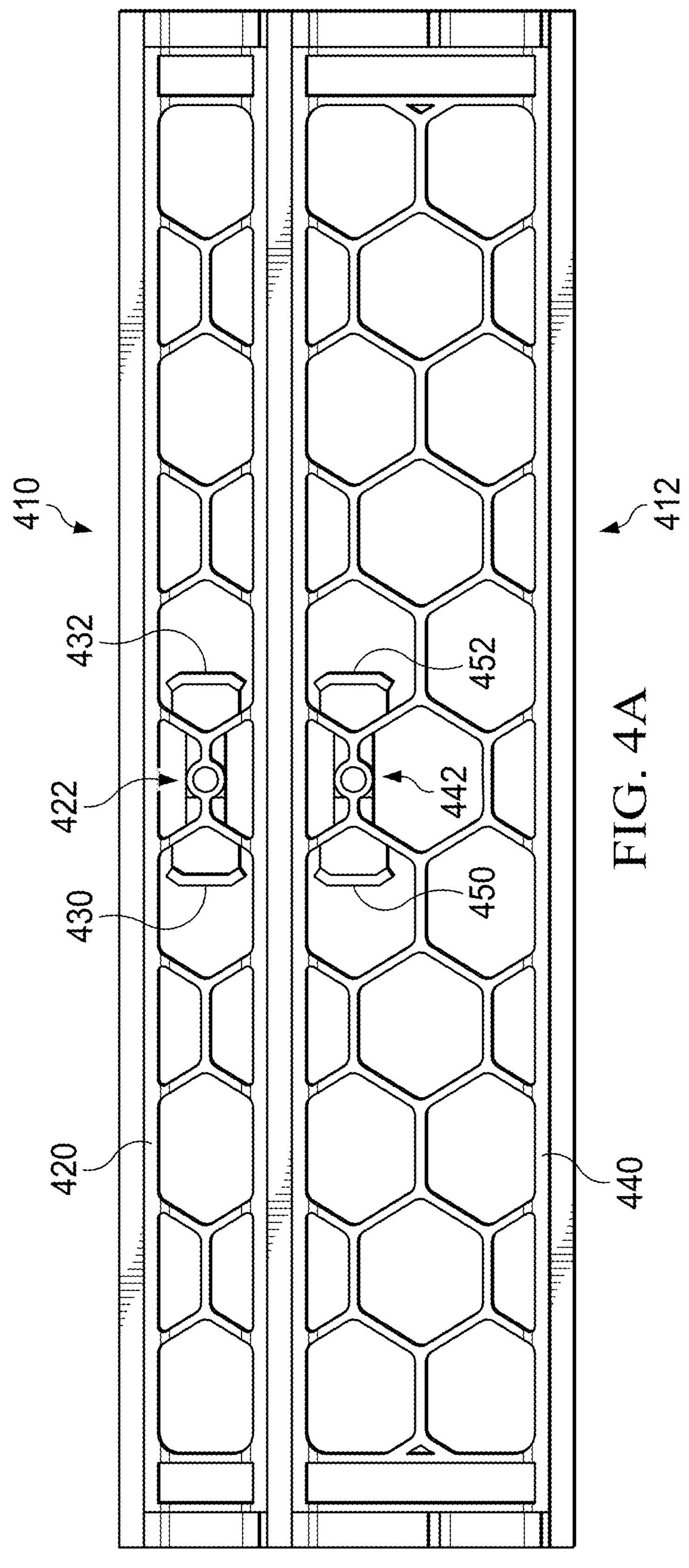
FIGS. 4A and 4B, generally referred to as FIG. 4, respectively, show views of a plurality of information handling system bezels.
Figure 4B:
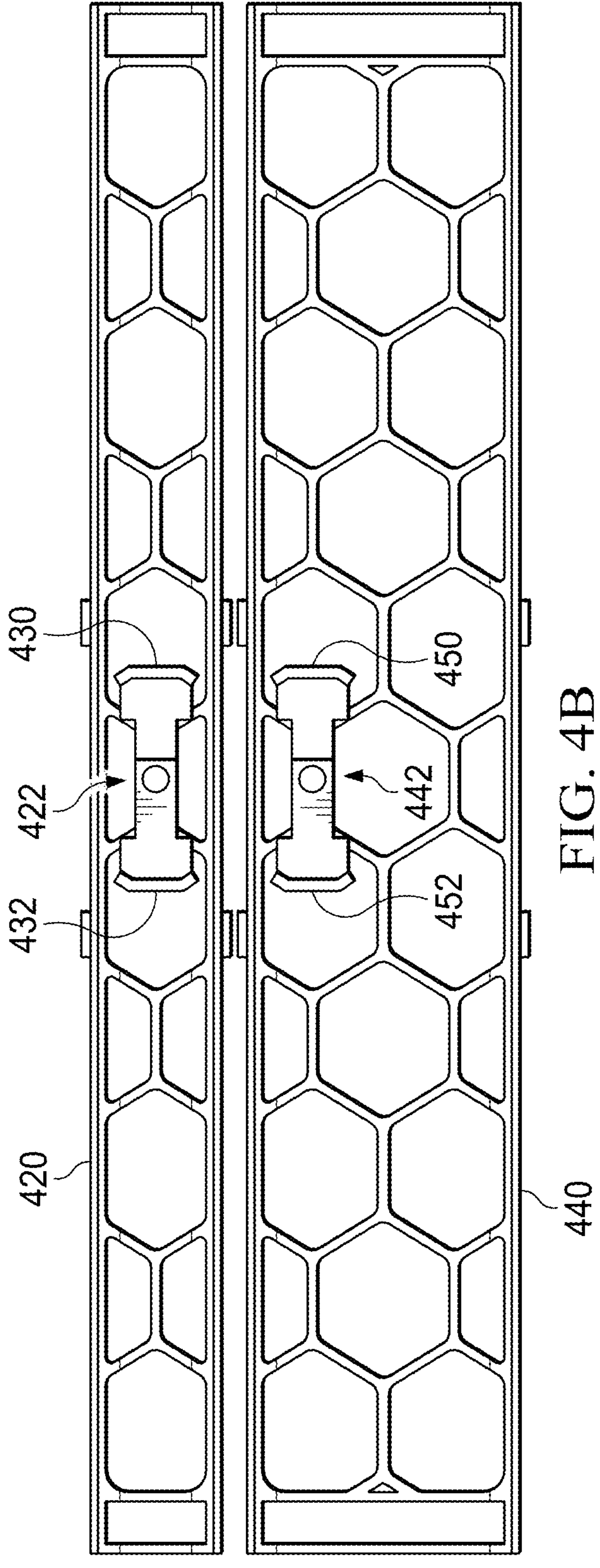

FIGS. 4A and 4B, generally referred to as FIG. 4, respectively, show views of a plurality of information handling system bezel components 410, 412. More specifically, FIG. 4A shows a front view of a plurality of information handling system bezel components 410, 412. FIG. 4A shows a rear view of a plurality of information handling system bezel components 410, 412. In certain embodiments, each of the plurality of information handling system bezel components 410, 412, corresponds to a bi-directional latch system 150.

In certain embodiments, bezel component 410 comprises a bezel of a first height. In certain embodiments, the bezel component 410 comprises a 1 U height bezel. In certain embodiments, the bezel component 410 includes a bezel 420 and a bezel latch 422 mounted to a center portion of the bezel. In certain embodiments, the bezel latch 422 includes a first bezel latch actuator 430, a second bezel latch actuator 432, or a combination thereof. In certain embodiments, the bezel latch can be actuated with one hand. In certain embodiments, the bezel component 410 is configured to be installed without the need for a side latching tab. In certain embodiments, the bezel installation is bi-directional (i.e., the bezel component 410 can be installed right side up or upside down relative to the front of the information handling system chassis). In certain embodiments, the right side of the bezel and the left side of the bezel are substantially similar as there is no need to have a latch on one side of the bezel and a mounting tab on the other side of the bezel.

In certain embodiments, bezel component 412 comprises a bezel of a second height. In certain embodiments, the bezel 412 comprises a 2 U height bezel. In certain embodiments, the bezel component 412 includes a bezel 440 and a bezel latch 442 mounted to a center portion of the bezel. In certain embodiments, the bezel latch 442 includes a first bezel latch actuator 450, a second bezel latch actuator 452, or a combination thereof. In certain embodiments, the bezel latch can be actuated with one hand. In certain embodiments, the bezel component 412 is configured to be installed without the need for a side latching tab. In certain embodiments, the bezel installation is bi-directional (i.e., the bezel component 412 can be installed right side up or upside down relative to the front of the information handling system chassis). In certain embodiments, the right side of the bezel and the left side of the bezel are substantially similar as there is no need to have a latch on one side of the bezel and a mounting tab on the other side of the bezel.

In certain embodiments, the bezel components 410, 412 include a plurality of decorative elements extending laterally across the bezel. In certain embodiments, each of the plurality of decorative elements includes a plurality of walls. In certain embodiments, subsets of the plurality of walls combine to provide hexagon shaped decorative elements, portions of a hexagon shaped decorative element, or a combination thereof. In certain embodiments, the portions of the hexagon shaped decorative elements present as substantially half of a full height hexagon shaped decorative element. In certain embodiments, the 1 U height bezel includes one row of hexagon shaped decorative elements alternating with top and bottom portions of hexagon shaped elements. In certain embodiments, the 2 U height bezel includes two rows of hexagon shaped decorative elements alternating with a single hexagon shaped decorative element along with top and bottom portions of hexagon shaped elements.

Figure 5A:
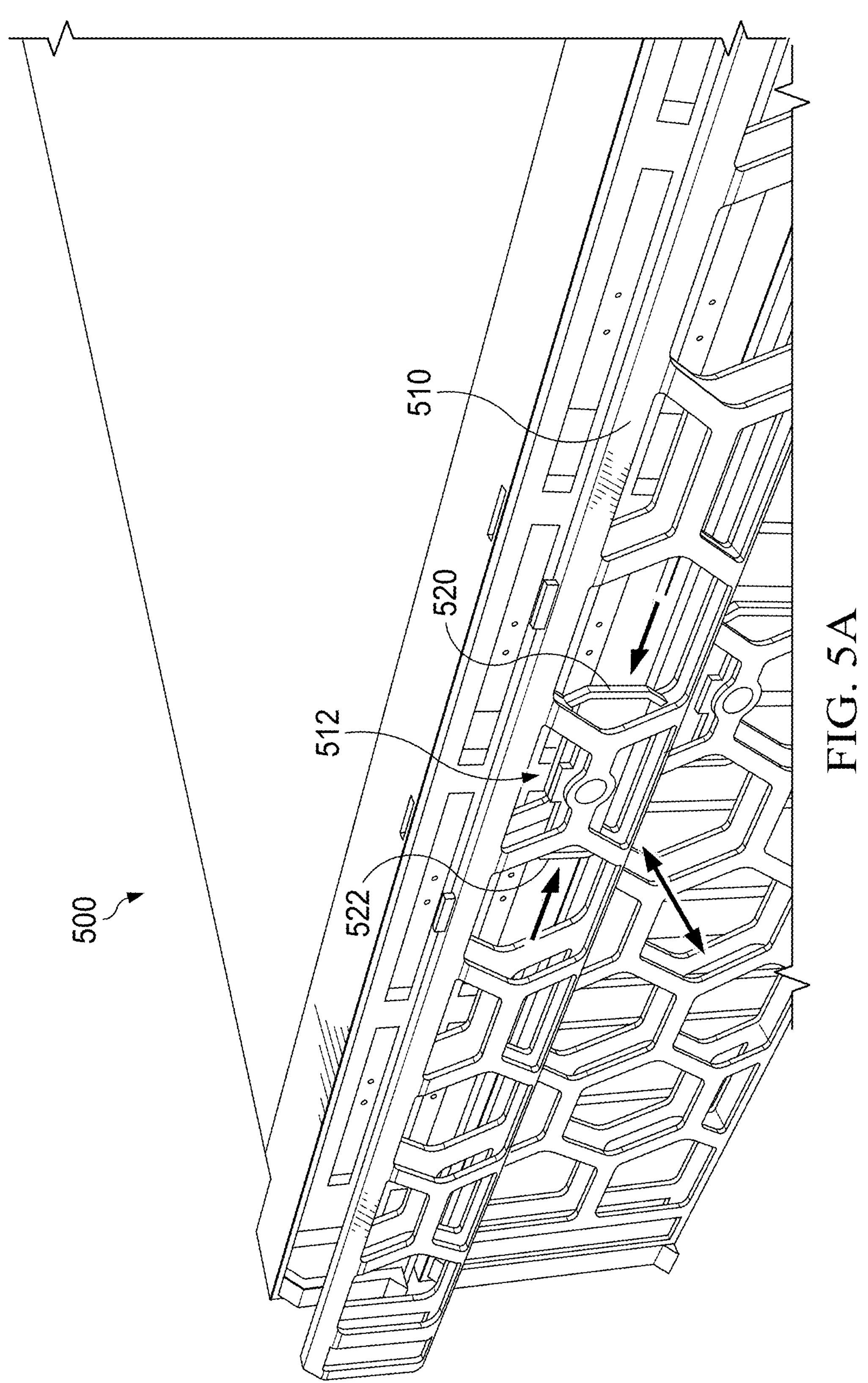
FIGS. 5A and 5B, generally referred to as FIG. 5, show views of an information handling system bezel with a bi-directional bezel latch system.
Figure 5B:
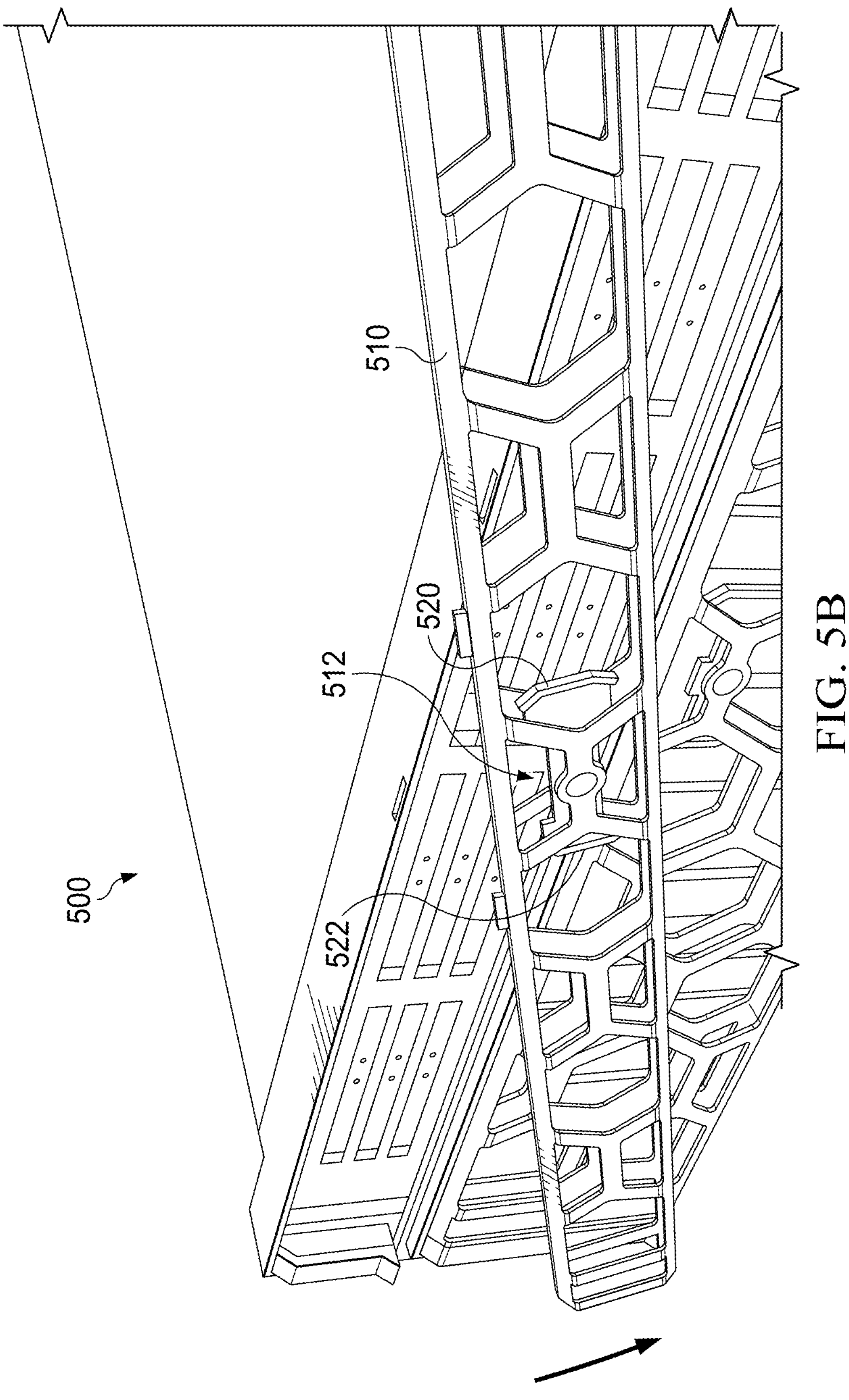

FIGS. 5A and 5B, generally referred to as FIG. 5, show views of an information handling system with a bi-directional information handling system bezel component 500. More specifically, FIG. 5A shows the installation or removal of the bi-directional information handling system bezel component 500. FIG. 5B shows a rotation of the bi-directional information handling system bezel component 500. In certain embodiments, the bi-directional information handling system bezel component 500 corresponds to a bi-directional latch system 150.

In certain embodiments, the bezel component 500 includes a bezel 510 and a bezel latch 512 mounted to a center portion of the bezel. In certain embodiments, the bezel latch 512 includes a first bezel latch actuator 520, a second bezel latch actuator 522, or a combination thereof. In certain embodiments, the bezel latch can be actuated by actuating the first bezel latch actuator 520, second bezel latch actuator 522, or a combination thereof. In certain embodiments, the bezel latch can be actuated by squeezing the first bezel latch actuator 520 and second bezel latch actuator 522 towards the center of the bezel latch 512. In certain embodiments, the bezel latch 512 can be actuated with one hand.

In certain embodiments, the bezel installation is bi-directional (i.e., the bezel component 500 can be installed right side up or upside down relative to the front of the information handling system chassis) (see e.g., FIG. 5B). In certain embodiments, the right side of the bezel and the left side of the bezel are substantially similar as there is no need to have a latch on one side of the bezel and a mounting tab on the other side of the bezel.

Figure 6:
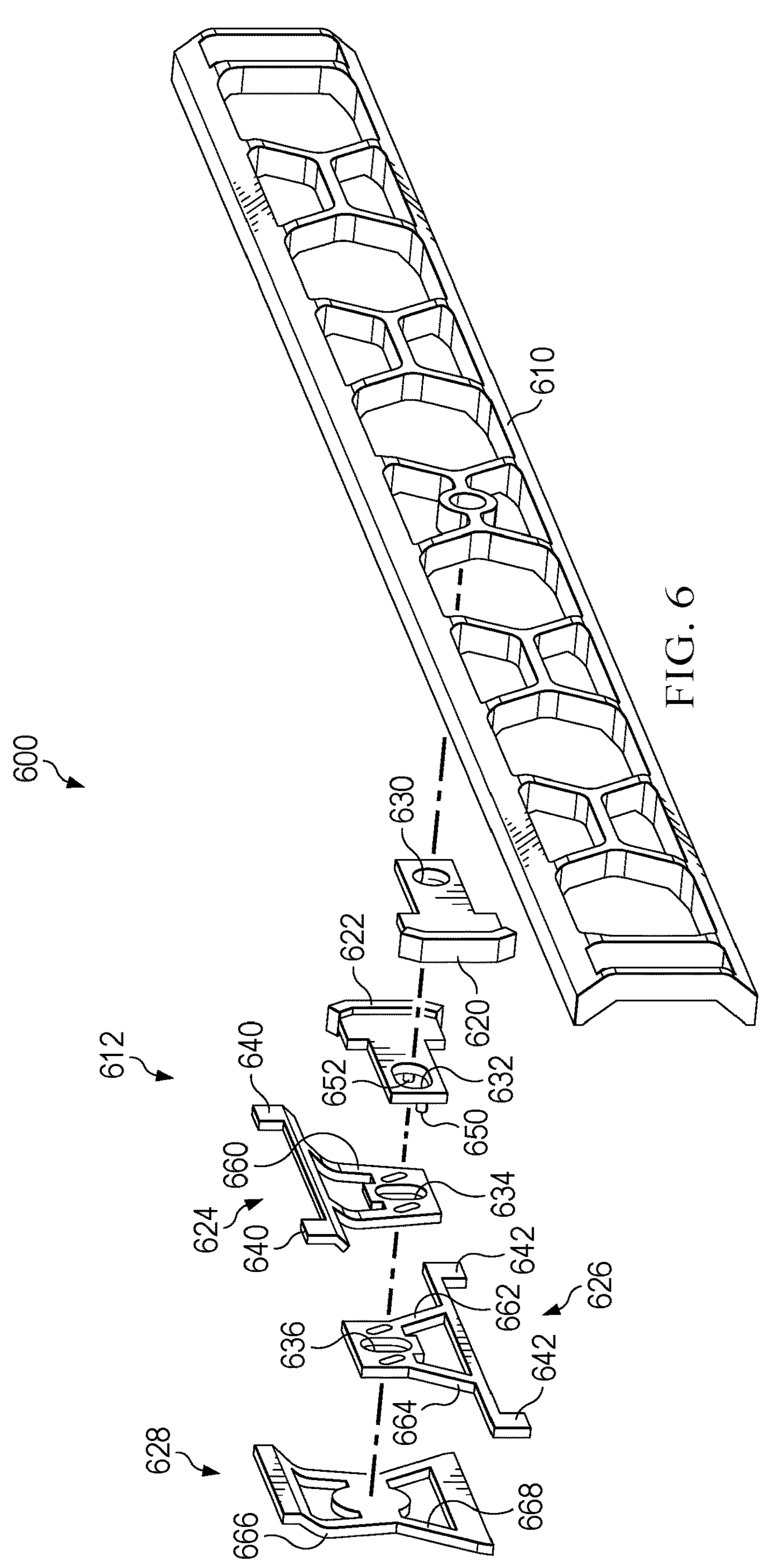
FIG. 6 shows an exploded perspective view of a bi-directional latch system.

FIG. 6 shows an exploded perspective view of a bi-directional latch system 600. In certain embodiments, the bi-directional latch system 600 corresponds to a bi-directional latch system 150. In certain embodiments, the bi-directional latch system 600 is configured to mount to an information handling system chassis of a first height. In certain embodiments, the bi-directional latch system 600 is configured to mount to a 1 U type information handling system chassis.

In certain embodiments, the bi-directional latch system 600 includes a bezel 610 and a bezel latch 612. In certain embodiments, the bezel latch 612 includes a first bezel latch actuator 620, a second bezel latch actuator 622, a latch top tab component 624, a latch bottom tab component 626 and a latch housing 628. In certain embodiments, the first bezel latch actuator 620, the second bezel latch actuator 622, the latch top tab component 624, and the latch bottom tab component 626 are physically attached to the latch housing 628. In certain embodiments, the first bezel latch actuator 620, the second bezel latch actuator 622, or a combination thereof, are attached to the latch top tab component 624 such that when the first bezel latch actuator 620, the second bezel latch actuator 622, or a combination thereof, are actuated, the latch top tab component 624 moves in a downward direction. In certain embodiments, the first bezel latch actuator 620, the second bezel latch actuator 622, or a combination thereof, are attached to the latch bottom tab component 626 such that when the first bezel latch actuator 620, the second bezel latch actuator 622, or a combination thereof, are actuated, the latch bottom tab component 626 moves in an upward direction. In certain embodiments, the downward direction of movement of the latch top tab component 624 and the upward direction of the latch bottom tab component 626 are each inward movement relative to the bezel latch housing 628.

In certain embodiments, the first bezel latch actuator 620 defines a first bezel latch actuator aperture 630. In certain embodiments, the second bezel latch actuator 622 defines a second bezel latch actuator aperture 632. In certain embodiments, the latch top tab component 624 defines a top tab component aperture 634. In certain embodiments, the latch bottom tab component 646 defines a bottom tab component aperture 636. In certain embodiments, the first bezel latch actuator 620, the second bezel latch actuator 622, the latch top tab component 624, and the latch bottom tab component 646 are physically attached to the latch housing 628 via the first bezel latch actuator aperture 630, second bezel latch actuator aperture 632, top tab component aperture 634 and the bottom tab component aperture 636.

In certain embodiments, the top tab component 624 includes one or more top tabs 640. In certain embodiments, the one or more top tabs 640 are configured to fit within respective notches defined along a top edge a font portion of an information handling system chassis (see e.g., FIG. 5A) when the bezel is attached to the information handling system chassis. In certain embodiments, the bottom tab component 626 includes one or more bottom tabs 642. In certain embodiments, the one or more bottom tabs 642 are configured to fit within respective notches defined along a bottom edge of a front portion of an information handling system chassis when the bezel is attached to the information handling system chassis.

In certain embodiments, the first bezel latch actuator 620, the second bezel latch actuator 622, or a combination thereof, include a first bezel latch actuator projection 650, a second bezel latch actuator projection 652, or a combination thereof. In certain embodiments, the latch top tab component 624 defines a first top tab component angled slot 654, a second top tab component angled slot 656, or a combination thereof. In certain embodiments, the latch bottom tab component 624 defines a first bottom tab component angled slot 658, a second top bottom component angled slot 659, or a combination thereof. In certain embodiments, the first bezel latch actuator projection 650 mates with the first top tab component angled slot 654, the first bottom tab angled slot 658, or a combination thereof. In certain embodiments, the second bezel latch actuator projection 652 mates with the second top tab component angled slot 659, the second bottom tab angled slot 659, or a combination thereof. In certain embodiments, the mating of the first bezel latch actuator projection 650 with the first top tab component angled slot 654, the first bottom tab angled slot 658, or a combination thereof, causes the top tab component 624 to move in a downward direction and the bottom tab component 626 to move in an upward direction when the first bezel latch actuator 620 is actuated. In certain embodiments, the mating of the second bezel latch actuator projection 652 with the second top tab component angled slot 654, the second bottom tab angled slot 658, or a combination thereof, causes the top tab component 624 to move in a downward direction and the bottom tab component 626 to move in an upward direction when the first bezel latch actuator 620 is actuated.

In certain embodiments, the top tab latch top tab component 624 includes side portions 660. In certain embodiments, the side portions 660 are shaped to correspond to respective decorative elements of the bezel 610. In certain embodiments, the latch bottom tab component 646 includes side portions 662 and a bottom portion 664. In certain embodiments, the side portions 660 and the bottom portion 664 are shaped to correspond to respective decorative elements of the bezel 610. In certain embodiments, the latch housing 628 includes side portions 666 and a bottom portion 668. In certain embodiments, the side portions 666 and the bottom portion 668 are shaped to correspond to respective decorative elements of the bezel.

Figure 7:
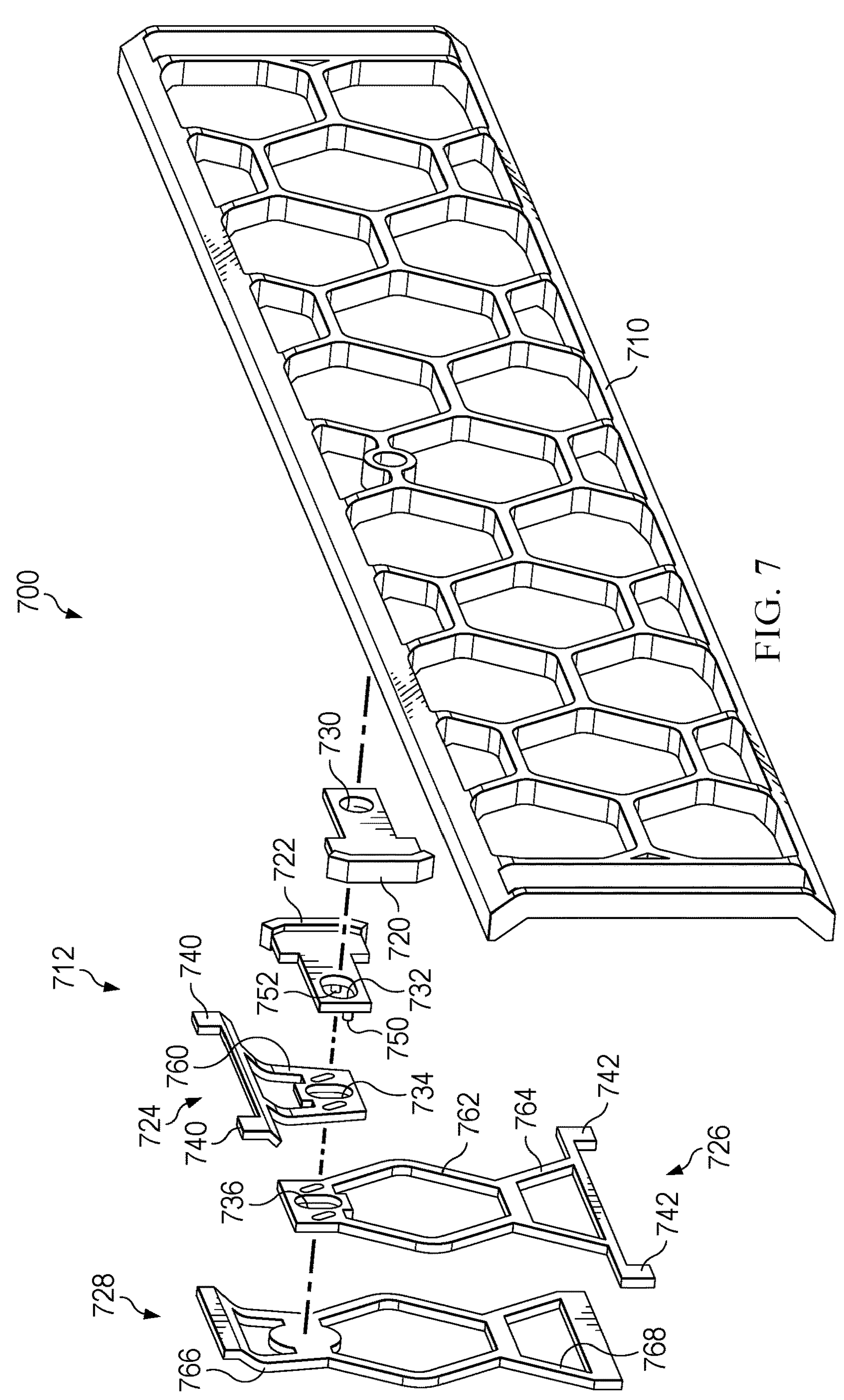
FIG. 7 shows an exploded perspective view of a bi-directional latch system.

FIG. 7 shows an exploded perspective view of a bi-directional latch system 700. In certain embodiments, the bi-directional latch system 700 corresponds to a bi-directional latch system 150. In certain embodiments, the bi-directional latch system 700 is configured to mount to an information handling system chassis of a second height. In certain embodiments, the bi-directional latch system 700 is configured to mount to a 2 U type information handling system chassis.

In certain embodiments, the bi-directional latch system 700 includes a bezel 710 and a bezel latch 712. In certain embodiments, the bezel latch 712 includes a first bezel latch actuator 720, a second bezel latch actuator 722, a latch top tab component 724, a latch bottom tab component 726 and a latch housing 728. In certain embodiments, the first bezel latch actuator 720, the second bezel latch actuator 722, the latch top tab component 724, and the latch bottom tab component 726 are physically attached to the latch housing 728. In certain embodiments, the first bezel latch actuator 720, the second bezel latch actuator 722, or a combination thereof, are attached to the latch top tab component 724 such that when the first bezel latch actuator 720, the second bezel latch actuator 722, or a combination thereof, are actuated, the latch top tab component 724 moves in a downward direction. In certain embodiments, the first bezel latch actuator 720, the second bezel latch actuator 722, or a combination thereof, are attached to the latch bottom tab component 726 such that when the first bezel latch actuator 720, the second bezel latch actuator 722, or a combination thereof, are actuated, the latch bottom tab component 726 moves in an upward direction. In certain embodiments, the downward direction of movement of the latch top tab component 724 and the upward direction of the latch bottom tab component 726 are each inward movement relative to the bezel latch housing 728.

In certain embodiments, the first bezel latch actuator 720 defines a first bezel latch actuator aperture 730. In certain embodiments, the second bezel latch actuator 722 defines a second bezel latch actuator aperture 732. In certain embodiments, the latch top tab component 724 defines a top tab component aperture 734. In certain embodiments, the latch bottom tab component 726 defines a bottom tab component aperture 736. In certain embodiments, the first bezel latch actuator 720, the second bezel latch actuator 722, the latch top tab component 724, and the latch bottom tab component 726 are physically attached to the latch housing 728 via the first bezel latch actuator aperture 730, second bezel latch actuator aperture 732, top tab component aperture 734 and the bottom tab component aperture 736.

In certain embodiments, the top tab component 724 includes one or more top tabs 740. In certain embodiments, the one or more top tabs 740 are configured to fit within respective notches defined along a top edge a font portion of an information handling system chassis (see e.g., FIG. 5A) when the bezel is attached to the information handling system chassis. In certain embodiments, the bottom tab component 726 includes one or more bottom tabs 742. In certain embodiments, the one or more bottom tabs 742 are configured to fit within respective notches defined along a bottom edge of a front portion of an information handling system chassis when the bezel is attached to the information handling system chassis.

In certain embodiments, the first bezel latch actuator 720, the second bezel latch actuator 722, or a combination thereof, include a first bezel latch actuator projection 750, a second bezel latch actuator projection 752, or a combination thereof. In certain embodiments, the latch top tab component 724 defines a first top tab component angled slot 754, a second top tab component angled slot 756, or a combination thereof. In certain embodiments, the latch bottom tab component 724 defines a first bottom tab component angled slot 758, a second top bottom component angled slot 759, or a combination thereof. In certain embodiments, the first bezel latch actuator projection 750 mates with the first top tab component angled slot 754, the first bottom tab angled slot 758, or a combination thereof. In certain embodiments, the second bezel latch actuator projection 752 mates with the second top tab component angled slot 759, the second bottom tab angled slot 759, or a combination thereof. In certain embodiments, the mating of the first bezel latch actuator projection 750 with the first top tab component angled slot 754, the first bottom tab angled slot 758, or a combination thereof, causes the top tab component 724 to move in a downward direction and the bottom tab component 726 to move in an upward direction when the first bezel latch actuator 720 is actuated. In certain embodiments, the mating of the second bezel latch actuator projection 752 with the second top tab component angled slot 754, the second bottom tab angled slot 758, or a combination thereof, causes the top tab component 724 to move in a downward direction and the bottom tab component 726 to move in an upward direction when the first bezel latch actuator 720 is actuated.

In certain embodiments, the top tab latch top tab component 724 includes side portions 760. In certain embodiments, the side portions 760 are shaped to correspond to respective decorative elements of the bezel 710. In certain embodiments, the latch bottom tab component 746 includes side portions 762 and a bottom portion 764. In certain embodiments, the side portions 760 and the bottom portion 764 are shaped to correspond to respective decorative elements of the bezel 710. In certain embodiments, the latch housing 728 includes side portions 766 and a bottom portion 768. In certain embodiments, the side portions 766 and the bottom portion 768 are shaped to correspond to respective decorative elements of the bezel.

Figure 8:
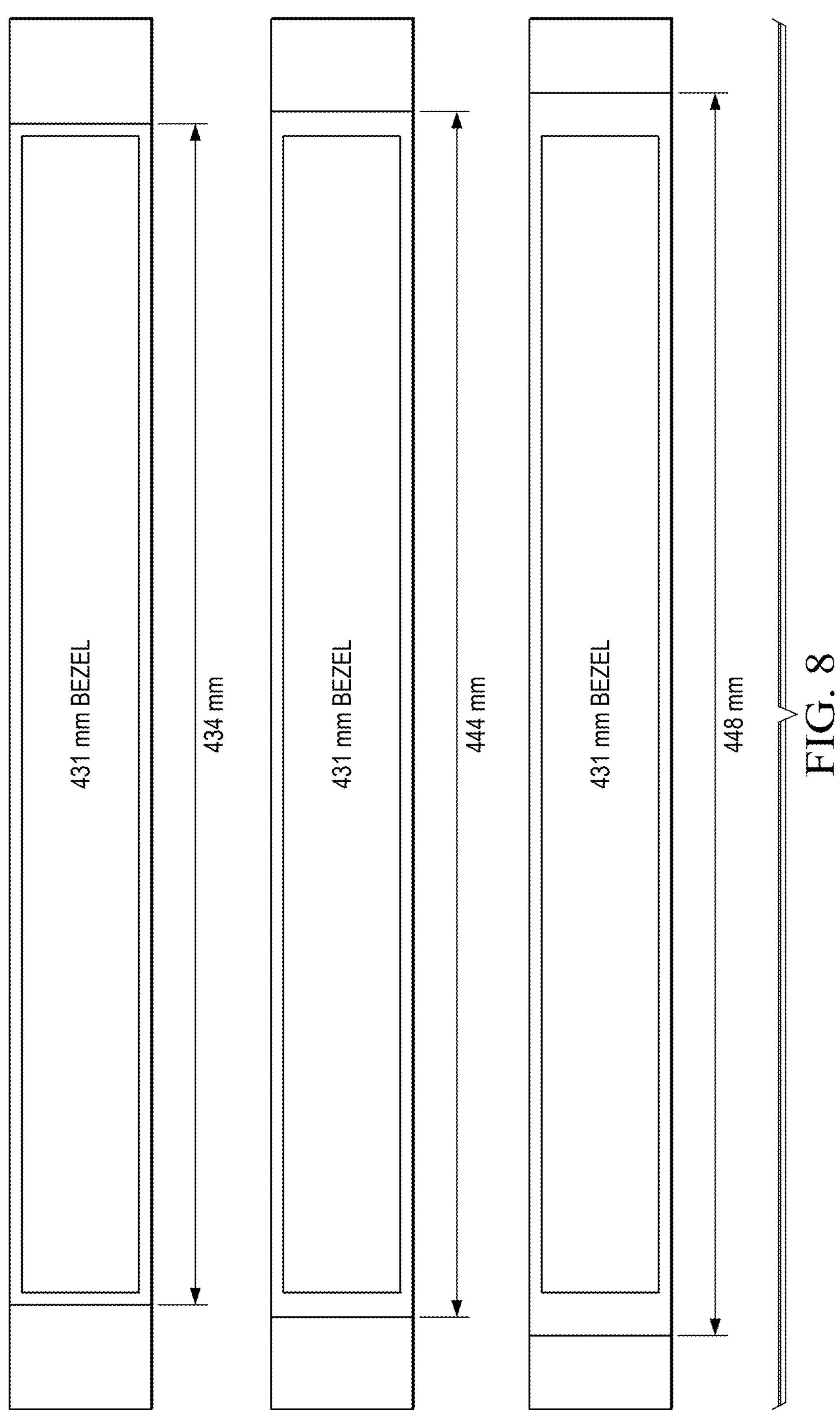
FIG. 8 shows front views of a plurality of information handling system bezels.

FIG. 8 shows front views of a plurality of information handling system bezel components 810, 812, 814. In certain embodiments, each of the plurality of information handling system bezel components 810, 812, 814 corresponds to a bi-directional latch system 150.

In certain embodiments, each of the plurality of information handling system bezel components 810, 812, 814 has a corresponding bezel width. In certain embodiments, each of the plurality of information handling system bezel components 810, 812, 814 has the same bezel width.

In certain embodiments, each bezel component 810, 812, 814 includes a respective bezel and a bezel latch mounted to a center portion of the bezel (as compared to a bezel which is mounted to the sides of the chassis in which it is installed). In certain embodiments, because the latching occurs at the center of the bezel, the same bezel component can be used with bezels of different widths. For example, in certain embodiments, the information handling system bezel component 810 is 431 mm wide and is configured to fit within a within a 434 mm wide chassis. In certain embodiments, the information handling system bezel component 812 is 431 mm wide and is configured to fit within a within a 444 mm wide chassis. In certain embodiments, the information handling system bezel component 814 is 431 mm wide and is configured to fit within a within a 448 mm wide chassis.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A bezel latch for use with a bezel latch system, the bezel latch comprising:

a bezel latch housing;

a bezel latch tab component; and, a bezel latch actuator, the bezel latch actuator being physically coupled with the bezel latch housing and the bezel latch tab component such that the bezel latch tab component moves inwardly relative to the bezel latch housing when the bezel latch actuator is actuated, the bezel latch housing, the bezel latch tab component and the bezel latch actuator being mounted to a center portion of a bezel, the bezel latch tab component extending vertically relative to the bezel latch actuator, the bezel latch tab component interacting with a center portion of a chassis to latch a bezel with the chassis.

2. The bezel latch of claim 1, wherein:

the bezel latch tab component comprises a bezel latch top tab component;

the bezel latch top tab component includes a top tab, the top tab being configured to fit within a notch defined along a top edge of a front portion of a chassis; and, the bezel latch top tab component is configured such that the bezel latch top tab component moves downwardly when the bezel latch actuator is actuated, when the bezel latch top tab component moves downwardly, the top tab disengages with the notch defined along the top edge of the front portion of a chassis.

3. The bezel latch of claim 1, wherein:

the bezel latch tab component comprises a bezel latch bottom tab component;

the bezel latch bottom tab component includes a bottom tab, the bottom tab being configured to fit within a notch defined along a bottom edge of a front portion of a chassis; and, the bezel latch bottom tab component is configured such that the bezel latch bottom tab component moves downwardly when the bezel latch actuator is actuated, when the bezel latch bottom tab component moves downwardly, the bottom tab disengages with the notch defined along the bottom edge of the front portion of a chassis.

4. The bezel latch of claim 1, wherein:

a bezel latch tab component defines an angled slot;

a bezel latch actuator includes a bezel latch actuator projection, the bezel latch actuator projection being configured to mate with the angled slot.

5. The bezel latch of claim 1, wherein:

the bezel latch housing includes a bezel latch housing side portion, the bezel latch housing side portion being shaped to correspond to a decorative element of the bezel.

6. The bezel latch of claim 1, wherein:

the bezel is configured to be mounted to at least one of a 1 U height information handling system chassis and a 2 U height information handling system chassis.

7. A bezel latch system comprising:

a bezel; and, a bezel latch, the bezel latch comprising a bezel latch housing;

a bezel latch tab component; and, a bezel latch actuator, the bezel latch actuator being physically coupled with the bezel latch housing and the bezel latch tab component such that the bezel latch tab component moves inwardly relative to the bezel latch housing when the bezel latch actuator is actuated, the bezel latch housing, the bezel latch tab component and the bezel latch actuator being mounted to a center portion of the bezel, the bezel latch tab component extending vertically relative to the bezel latch actuator, the bezel latch tab component interacting with a center portion of a chassis to latch the bezel with the chassis.

8. The bezel latch system of claim 7, wherein:

the bezel latch tab component comprises a bezel latch top tab component;

the bezel latch top tab component includes a top tab, the top tab being configured to fit within a notch defined along a top edge of a front portion of a chassis; and, the bezel latch top tab component is configured such that the bezel latch top tab component moves downwardly when the bezel latch actuator is actuated, when the bezel latch top tab component moves downwardly, the top tab disengages with the notch defined along the top edge of the front portion of a chassis.

9. The bezel latch system of claim 7, wherein:

the bezel latch tab component comprises a bezel latch bottom tab component;

the bezel latch bottom tab component includes a bottom tab, the bottom tab being configured to fit within a notch defined along a bottom edge of a front portion of a chassis; and, the bezel latch bottom tab component is configured such that the bezel latch bottom tab component moves downwardly when the bezel latch actuator is actuated, when the bezel latch bottom tab component moves downwardly, the bottom tab disengages with the notch defined along the bottom edge of the front portion of a chassis.

10. The bezel latch system of claim 7, wherein:

a bezel latch tab component defines an angled slot;

a bezel latch actuator includes a bezel latch actuator projection, the bezel latch actuator projection being configured to mate with the angled slot.

11. The bezel latch system of claim 7, wherein:

the bezel latch housing includes a bezel latch housing side portion, the bezel latch housing side portion being shaped to correspond to a decorative element of the bezel.

12. The bezel latch system of claim 11, wherein:

the bezel is configured to be mounted to at least one of a 1 U height information handling system chassis and a 2 U height information handling system chassis.

13. A system comprising:

a chassis;

a processor contained within the chassis;

a data bus coupled to the processor; and, a bezel latch system coupled with the chassis, the bezel latch system comprising a bezel; and, a bezel latch, the bezel latch comprising a bezel latch housing;

a bezel latch tab component; and, a bezel latch actuator, the bezel latch actuator being physically coupled with the bezel latch housing and the bezel latch tab component such that the bezel latch tab component moves inwardly relative to the bezel latch housing when the bezel latch actuator is actuated, the bezel latch housing, the bezel latch tab component and the bezel latch actuator being mounted to a center portion of the bezel, the bezel latch tab component extending vertically relative to the bezel latch actuator, the bezel latch tab component interacting with a center portion of the chassis to latch a bezel with the chassis.

14. The system of claim 13, wherein:

the bezel latch tab component comprises a bezel latch top tab component;

the bezel latch top tab component includes a top tab, the top tab being configured to fit within a notch defined along a top edge of a front portion of a chassis; and, the bezel latch top tab component is configured such that the bezel latch top tab component moves downwardly when the bezel latch actuator is actuated, when the bezel latch top tab component moves downwardly, the top tab disengages with the notch defined along the top edge of the front portion of a chassis.

15. The system of claim 13, wherein:

the bezel latch tab component comprises a bezel latch bottom tab component;

the bezel latch bottom tab component includes a bottom tab, the bottom tab being configured to fit within a notch defined along a bottom edge of a front portion of a chassis; and, the bezel latch bottom tab component is configured such that the bezel latch bottom tab component moves downwardly when the bezel latch actuator is actuated, when the bezel latch bottom tab component moves downwardly, the bottom tab disengages with the notch defined along the bottom edge of the front portion of a chassis.

16. The system of claim 13, wherein:

a bezel latch tab component defines an angled slot;

a bezel latch actuator includes a bezel latch actuator projection, the bezel latch actuator projection being configured to mate with the angled slot.

17. The system of claim 13, wherein:

the bezel latch housing includes a bezel latch housing side portion, the bezel latch housing side portion being shaped to correspond to a decorative element of the bezel.

18. The system of claim 17, wherein:

the bezel is configured to be mounted to at least one of a 1 U height information handling system chassis and a 2 U height information handling system chassis.

* * * * *